United States Patent
Chen et al.

(10) Patent No.: US 11,043,435 B1
(45) Date of Patent: Jun. 22, 2021

(54) SEMICONDUCTOR DIE WITH HYBRID WIRE BOND PADS

(71) Applicant: Innogrit Technologies Co., Ltd., Shanghai (CN)

(72) Inventors: Lin Chen, Cupertino, CA (US); Gang Zhao, Chandler, AZ (US); Wei Jiang, Fremont, CA (US); Shiann-Ming Liou, Campbell, CA (US)

(73) Assignee: Innogrit Technologies Co., Ltd., Shanghai (CN)

( * ) Notice: Subject to any disclaimer, the term of this patent is extended or adjusted under 35 U.S.C. 154(b) by 0 days.

(21) Appl. No.: 16/876,394

(22) Filed: May 18, 2020

(51) Int. Cl.
*H01L 21/66* (2006.01)
*H01L 23/00* (2006.01)

(52) U.S. Cl.
CPC .............. *H01L 22/32* (2013.01); *H01L 24/03* (2013.01); *H01L 24/05* (2013.01); *H01L 24/06* (2013.01); *H01L 2224/04042* (2013.01); *H01L 2224/06177* (2013.01)

(58) Field of Classification Search
CPC ....................................................... H01L 22/32
See application file for complete search history.

(56) References Cited

U.S. PATENT DOCUMENTS

2002/0024149 A1* 2/2002 Nakamura ............ H01L 23/528
257/786
2003/0173668 A1* 9/2003 Downey ................ H01L 22/32
257/750

* cited by examiner

*Primary Examiner* — William A Harriston
(74) *Attorney, Agent, or Firm* — IPro, PLLC; Xiaomin Huang

(57) ABSTRACT

Apparatus and methods are provided for bond bads layout and structure of semiconductor dies. According to various aspects of the subject innovation, the provided techniques may provide a semiconductor die that may comprise an outer bond pad elongated in a first direction parallel to an edge of the semiconductor die and an inner bond pad elongated in a second direction perpendicular to the edge of the semiconductor die. The outer bond pad may have a probing area and two wire bond areas aligned in the first direction and the inner bond pad may have one probing area and one wire bond area aligned in the second direction. The outer bond pad may be positioned closer to the edge of the semiconductor die than the inner bond pad.

20 Claims, 2 Drawing Sheets

SEMICONDUCTOR DIE WITH HYBRID WIRE BOND PADS

TECHNICAL FIELD

The disclosure herein relates to semiconductor dies, particularly relates to wire bond pads for semiconductor dies.

BACKGROUND

Integrated Circuits (ICs) are fundamental building blocks of modern electronics. More and more functions are being integrated into IC chips and more connections need to be provided by semiconductor dies. Conventionally, the connections are provided by wire bonding, which electrically connects a die to a substrate or leadframe using Au, Cu, Ag alloy or any electrically conductive wires. Connections between the die and the substrate allow input/output (I/O) signals on the die to enter or leave by way of bond pads located on edges of the die. In addition, power and ground for the die are also provided by the bond pads. Moreover, semiconductor dies need to be tested before wire bonding and thus test probing areas need to be provided also by bond pads. Normally, a bond pad is designed to be either a long pad to separate the bond area and the probing area or a short pad with the bond area and the probing area overlapped. Overlapping bond area and probing area causes reliability issues because wires will be bonding on top of the probing areas which may affect the bonding integrity and cause bond wire lift problem. Therefore, there is contention for space (or "real estate") in bond pad design.

SUMMARY

A continuing need exists for improved bond pads structure and layout. The disclosed subject matter relates to apparatuses and methods that provide hybrid wire bond pads. According to various aspects of the subject innovation, the provided techniques may form at least two types of bond pads on a semiconductor die. The hybrid wire bond pads structure may save the die size with double or more tiers of wire bonding pads by placing bond pads with shorter height along the edge of the die and placing bond pads with longer height at the inner side of the die. In one embodiment, the outer bond pads may provide power and ground connections and may have the same pad height as regular short pad design. The new probing area may be in the middle of the rectangular pad between of the bonding areas. The hybrid wire bond pads may be cost effective and may reduce the demand on size needed for bond pads.

In an exemplary embodiment, there is provided a semiconductor die that may comprise an outer bond pad elongated in a first direction parallel to an edge of the semiconductor die and an inner bond pad elongated in a second direction perpendicular to the edge of the semiconductor die. The outer bond pad may have a probing area and two wire bond areas aligned in the first direction and the inner bond pad may have one probing area and one wire bond area aligned in the second direction. The outer bond pad may be positioned closer to the edge of the semiconductor die than the inner bond pad.

In another exemplary embodiment, there is provided a semiconductor die that may comprise a row of outer bond pads aligned in a row direction parallel to an edge of the semiconductor die and a row of inner bond pads aligned in the row direction along the row of outer bond pads. The row of inner bond pads may be positioned on a side of the row of outer bond pads opposite the edge of the semiconductor die. Each of the row of outer bond may be elongated in the row direction and have two wire bond areas and a probing area. Each of the row of inner bond pads may be elongated perpendicular to the row direction and have a wire bond area and a probing area.

In yet another exemplary embodiment, there is provide a method for making a semiconductor die. The method may comprise forming an outer bond pad elongated in a first direction parallel to an edge of the semiconductor die and forming an inner bond pad elongated in a second direction perpendicular to the edge of the semiconductor die. The outer bond pad may have a probing area and two wire bond areas aligned in the first direction. The inner bond pad may have one probing area and one wire bond area aligned in the second direction. The outer bond pad may be positioned closer to the edge of the semiconductor die than the inner bond pad.

DETAILED DESCRIPTION

Figure 1:
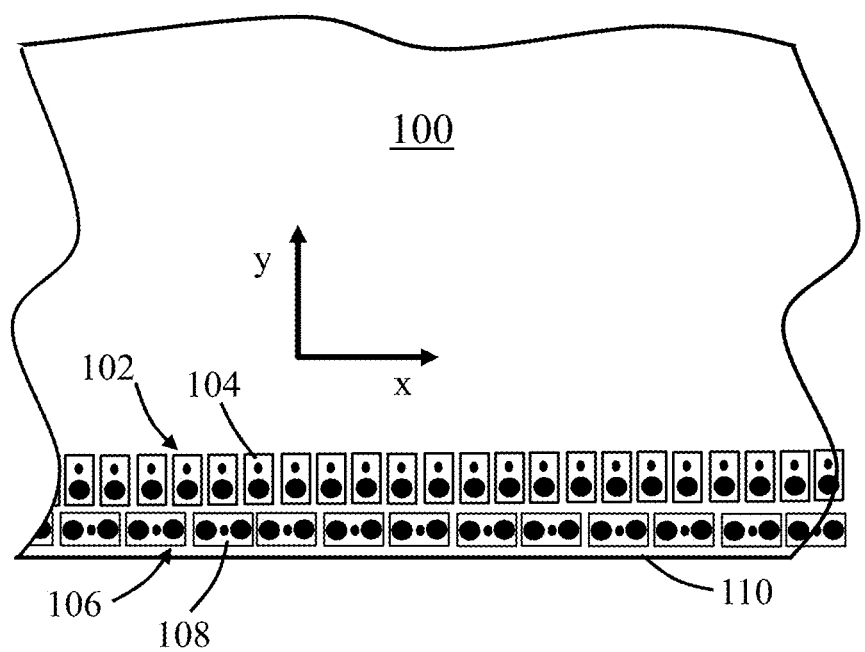
FIG. 1 schematically shows a top view of a portion of a semiconductor die in accordance with an embodiment of the present disclosure.

Specific embodiments according to the present disclosure will now be described in detail with reference to the accompanying figures. Like elements in the various figures are denoted by like reference numerals for consistency.

An exemplary embodiment according to the present disclosure may provide a semiconductor die that may comprise hybrid wire bond pads. According to various aspects of the subject disclosure, the provided techniques may form at least two types of bond pads on a semiconductor die: an outer bond pad elongated in a first direction parallel to an edge of the semiconductor die and an inner bond pad elongated in a second direction perpendicular to the edge of the semiconductor die. The outer bond pad may have a probing area and two wire bond areas aligned in the first direction and the inner bond pad may have one probing area and one wire bond area aligned in the second direction. The outer bond pad may be positioned closer to the edge of the semiconductor die than the inner bond pad. In one embodiment, the semiconductor die may comprise an integrated circuit (IC).

FIG. 1 schematically shows a top view of a portion of a semiconductor die 100 in accordance with an embodiment of the present disclosure. The semiconductor die 100 may comprise a row 102 of inner bond pads 104, a row 106 of outer bond pads 108 and an edge 110. In one embodiment, the die 100 may be a semiconductor die with integrated circuit (IC). The row 106 of outer bond pads 108 may be aligned in the x direction, which may be parallel to the edge 110. And the row 102 of the inner bond pads 104 may also be substantially aligned in the x direction.

Each outer bond pads 108 may be elongated in the x direction. That is, the length of an outer bond pad 108 in the x direction is larger than the length of the outer bond pad 108 in the y direction, which may be perpendicular to the x direction. Each inner bond pads 104 may be elongated in the y direction. That is, the length of an inner bond pad 104 in the y direction may be larger than the length of the inner bond pad 104 in the x direction.

It should be noted that the edge 110 may be part of the perimeter of the die 100, which may have a shape of a rectangle or square. Moreover, the row 102 of inner bond pads 104 and the row 106 of outer bond pads 108 may be located in a pad region of the die 100. In some embodiments, the row 102 of inner bond pads 104 may include pads for signal (e.g., I/O or control signals), power and ground, and the row 106 of outer bond pads 108 may be power and ground pads. That is, the row 102 of inner bond pads 104 may provide signal, ground and power connections for the semiconductor die 100 and the row 106 of outer bond pads 108 may provide power and ground connections for the semiconductor die 100. In at least one embodiment, some pads of the row 106 of outer bond pads 108 may provide power connections and some other pads of the row 106 of outer bond pads 108 may provide ground connections. In general, which outer bond pad 108 provides power and which outer bond pad 108 provides ground may be determined by the semiconductor die 100's power and ground distribution design. In at least one embodiment, the row 106 of outer bond pads 108 may provide power and ground connections by adjacent pads. That is, if an outer bond pad 108 provides power, the two adjacent outer bond pads 108 next to it may provide ground.

In some embodiments, an inner bond pad 104 and an outer bond pad 108 may be formed with Aluminum (Al), Copper or any other conductive material.

Figure 2:
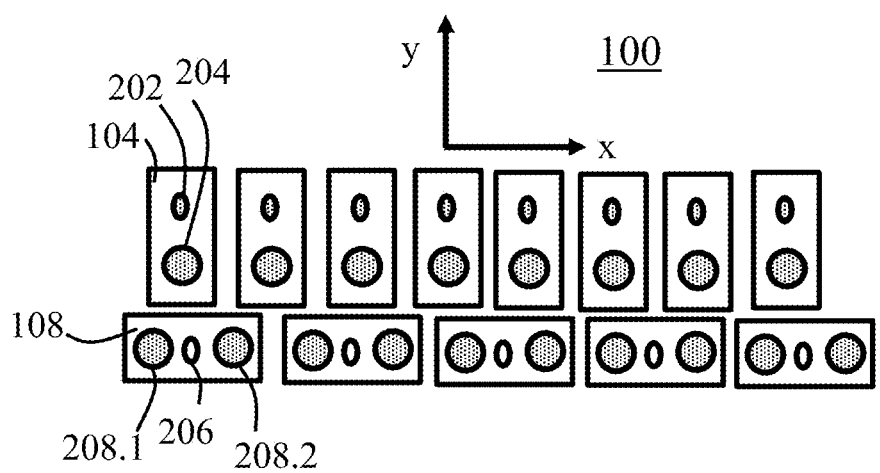
FIG. 2 schematically shows a more detailed view of a portion of the semiconductor die in accordance with an embodiment of the present disclosure.

Referring now to FIG. 2, therein is shown a more detailed view of a portion of the semiconductor die 100. The more detailed view depicts that an inner bond pad 104 may comprise a probing area 202 and a wire bond area 204, and an outer bond pad 108 may comprise a probing area 206 and two wire bond areas 208.1 and 208.2. In one embodiment, a wire bond area (e.g., the wire bond areas 204, 208.1 or 208.2) may be a wire ball bond area for making a permanent connection in a final product of an IC chip, in which the semiconductor die 100 may be packaged. The permanent connection may provide an electrical interconnection between the IC chip and the outside world by wire bonding.

A probing area (e.g., the probing area 202 or 206) may be a probe mark area, a probe point, or a portion of a pad where a lead or a probe tip of a probe card contacts. The probing area may be used for probe test and not for providing permanent connection to the semiconductor die 100 in the final product of an IC chip. In some embodiments, on the outer bond pad 108, the probing area 206 may be smaller than either of the wire bond areas 208.1 and 208.2; and on the inner bond pad 104, the probing area 202 may be smaller than the wire bond area 204. Moreover, in some embodiments, the probing area 206 may be positioned between the two wire bond areas 208.1 and 208.2.

In some embodiments, the probing area 202 and the wire bond area 204 of the inner bond pad 104 may be aligned in the y direction. In one embodiment, the probing area 202 may be further away from the edge of the semiconductor die 100 than the wire bond area 204, but in another embodiment, the wire bond area 204 may be further away from the edge of the semiconductor die 100 than the probing area 202.

In some embodiments, the probing area 206 and the two wire bond areas 208.1 and 208.2 of the outer bond pad 108 may be aligned in the x direction. In at least one embodiment, the probing area 206 may be positioned between the two wire bond areas 208.1 and 208.2.

It should be noted that, the wire bond area 204 of the inner bond pad 104 and the two wire bond areas 208.1 and 208.2 of the outer bond pad 108 may be shown to be circular, and the probing area 202 of the inner bond pad 104 and the probing area 206 of the outer bond pad 108 may be shown to be oval, respectively, for illustrative purpose. But it is understood that they may be formed in different geometric configurations. For example, any wire bond area (e.g., the wire bond area 204 of the inner bond pad 104 and the two wire bond areas 208.1 and 208.2) and any probing area (e.g., the probing area 202 of the inner bond pad 104 and the probing area 206 of the outer bond pad 108) may be formed in a non-standard geometric shape where a center is not known by a standard geometric definition. In this situation, a center may be defined by a center of the area distribution or any other suitable manner and the alignment may be achieved by substantially aligning the centers of respective probing area and wire bond area.

Moreover, it should be noted that the shapes of the inner bond pad 104 and outer bond pad 108 need not be rectangular or even a standard geometric shape. In various embodiments, the inner bond pad 104 may be elongated in the y direction to accommodate the probing area 202 and the wire bond area 204 and the outer bond pad 108 may be elongated in the x direction to accommodate the probing area 206 and the two wire bond areas 208.1 and 208.2. Also, each inner bond pad 104 of the inner row 102 need not be identical. For example, some inner bond pad 104 may have irregular shapes caused by processing techniques. Similarly, each outer bond pad 108 of the outer row 106 need not be identical. For example, some outer bond pad 108 may have irregular shapes caused by processing techniques.

Figure 3:
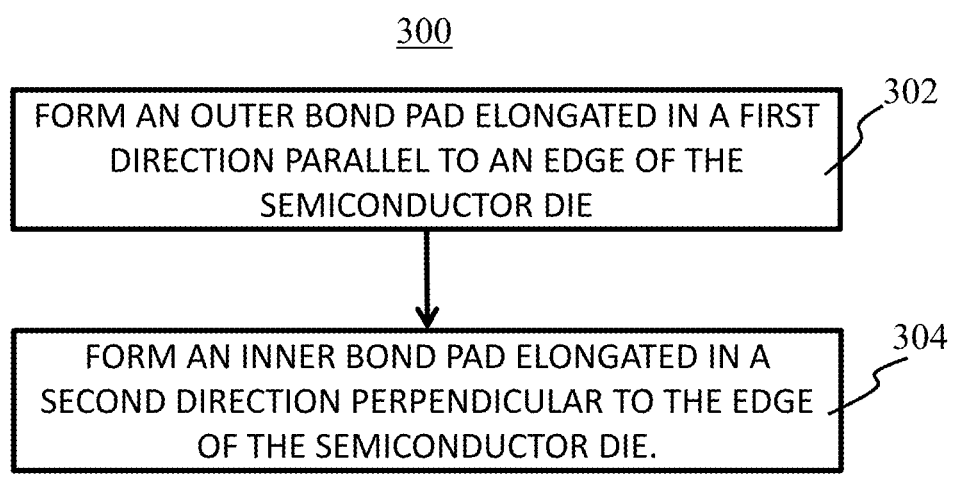
FIG. 3 is a flowchart of a process for making a semiconductor die in accordance with an embodiment of the present disclosure.

FIG. 3 is a flowchart of a process 300 for making a semiconductor die in accordance with an embodiment of the present disclosure. At block 302, an outer bond pad may be formed on a semiconductor die. The outer bond pad may be elongated in a first direction parallel to an edge of the semiconductor die. For example, an outer bond pad 108 elongated in the x direction may be formed on the semiconductor die 100. In an embodiment, the outer bond pad 108 may have a probing area 206 and two wire bond areas 208.1 and 208.2 aligned in the x direction. At block 304, an inner bond pad may be formed on the semiconductor die. The inner bond pad may be elongated in a second direction perpendicular to the edge of the semiconductor die. The inner bond pad may have one probing area and one wire bond area aligned in the second direction. For example, an inner bond pad 104 elongated in the x direction may be formed on the semiconductor die 100. In an embodiment, the inner bond pad 104 may comprise a probing area 202 and a wire bond area 204 aligned in the y direction. The outer bond pad 108 may be positioned closer to the edge 110 of the semiconductor die 100 than the inner bond pad 104.

In one embodiment, the process 300 may further comprise forming a row of outer bond pads aligned in the first direction with the outer bond pad as one of the row of outer bond pads and forming a row of inner bond pads aligned in the first direction with the inner bond pad as one of the row of inner bond pads. For example, row 106 of outer bond pads may be formed with the outer bond pad formed in block 302 as one of them and the row 102 of inner bond pads may be formed with the inner bond pad formed in block 304 as one of them. Each of the row of outer bond pads may have a first elongated shape with a probing area and two wire bond areas aligned in the x direction and each of the row of inner bond pads may have a second elongated shape with one probing area and one wire bond area aligned in the y direction.

In various embodiments, the process 300 may be performed using any suitable bond pad making techniques, for example, chemical etching or mechanical grinding.

In an exemplary embodiment, there is provided a semiconductor die that may comprise an outer bond pad elongated in a first direction parallel to an edge of the semiconductor die and an inner bond pad elongated in a second direction perpendicular to the edge of the semiconductor die. The outer bond pad may have a probing area and two wire bond areas aligned in the first direction and the inner bond pad may have one probing area and one wire bond area aligned in the second direction. The outer bond pad may be positioned closer to the edge of the semiconductor die than the inner bond pad.

In one embodiment, the probing area of the outer bond pad may be smaller than either of the two wire bond areas of the outer bond pad.

In one embodiment, the probing area of the outer bond pad may be positioned between the two wire bond areas of the outer bond pad.

In one embodiment, the probing area of the inner bond pad may be smaller than the wire bond area of the inner bond pad.

In one embodiment, the outer bond pad may be configured to provide ground or power connection to electrical circuit in the semiconductor die.

In one embodiment, the outer bond pad may be one of a row of outer bond pads aligned in the first direction and the inner bond pad may be one of a row of inner bond pads aligned in the first direction.

In one embodiment, each of the row of outer bond pads may have an elongated shape with a probing area and two wire bond areas aligned in the first direction, and each of the row of inner bond pads has another elongated shape with one probing area and one wire bond area aligned in the second direction.

In one embodiment, each outer bond pad of the row of outer bond pads may be configured to provide power connection or ground connection.

In another exemplary embodiment, there is provided a semiconductor die that may comprise a row of outer bond pads aligned in a row direction parallel to an edge of the semiconductor die and a row of inner bond pads aligned in the row direction along the row of outer bond pads. The row of inner bond pads may be positioned on a side of the row of outer bond pads opposite the edge of the semiconductor die. Each of the row of outer bond may be elongated in the row direction and have two wire bond areas and a probing area. Each of the row of inner bond pads may be elongated perpendicular to the row direction and have a wire bond area and a probing area.

In one embodiment, the probing area of an outer bond pad of the row of the outer bond pads may be smaller than either of the two wire bond areas of the outer bond pad.

In one embodiment, the probing area of the outer bond pad and the two wire bond areas of the outer bond pad may be aligned in the row direction with the probing area positioned between the two wire bond areas.

In one embodiment, the probing area of the inner bond pad may be smaller than the wire bond area of the inner bond pad.

In one embodiment, the probing area of the inner bond pad and the wire bond area of the inner bond pad may be aligned perpendicular to the row direction.

In one embodiment, each outer bond pad of the row of outer bond pads may be configured to provide power connection or ground connection.

In yet another exemplary embodiment, there is provide a method for making a semiconductor die. The method may comprise forming an outer bond pad elongated in a first direction parallel to an edge of the semiconductor die and forming an inner bond pad elongated in a second direction perpendicular to the edge of the semiconductor die. The outer bond pad may have a probing area and two wire bond areas aligned in the first direction. The inner bond pad may have one probing area and one wire bond area aligned in the second direction. The outer bond pad may be positioned closer to the edge of the semiconductor die than the inner bond pad.

In one embodiment, the probing area of the outer bond pad may be smaller than either of the two wire bond areas of the outer bond pad and may be positioned between the two wire bond areas of the outer bond pad.

In one embodiment, the probing area of the inner bond pad may be smaller than the wire bond area of the inner bond pad.

In one embodiment, the outer bond pad may be configured to provide ground or power connection to electrical circuit in the semiconductor die.

In one embodiment, the method may further comprise forming a row of outer bond pads aligned in the first direction with the outer bond pad as one of the row of outer bond pads and forming a row of inner bond pads aligned in the first direction with the inner bond pad as one of the row of inner bond pads. Each of the row of outer bond pads may have a first elongated shape with a probing area and two wire bond areas aligned in the first direction and each of the row of inner bond pads may have a second elongated shape with one probing area and one wire bond area aligned in the second direction.

In one embodiment, each outer bond pad of the row of outer bond pads may be configured to provide power connection or ground connection.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

The terms "coupled to," along with its derivatives, may be used herein. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

The terms chip, die, integrated circuit, monolithic device, semiconductor device, and microelectronic device are often used interchangeably in the microelectronics field. The present invention is applicable to all of the above as they are generally understood in the field.

While various aspects and embodiments have been disclosed herein, other aspects and embodiments will be apparent to those skilled in the art. The various aspects and embodiments disclosed herein are for purposes of illustra-

What is claimed is:

1. A semiconductor die, comprising:
   an outer bond pad elongated in a first direction parallel to an edge of the semiconductor die, the outer bond pad having a probing area and two wire bond areas aligned in the first direction; and
   an inner bond pad elongated in a second direction perpendicular to the edge of the semiconductor die, the inner bond pad having one probing area and one wire bond area aligned in the second direction, wherein the outer bond pad is positioned closer to the edge of the semiconductor die than the inner bond pad, wherein the probing area of the outer bond pad is smaller than either of the two wire bond areas of the outer bond pad.

2. The semiconductor die of claim 1, wherein the probing area of the outer bond pad is positioned between the two wire bond areas of the outer bond pad.

3. The semiconductor die of claim 1, wherein the outer bond pad is configured to provide ground or power connection to electrical circuit in the semiconductor die.

4. The semiconductor die of claim 1, wherein the probing area of the inner bond pad is smaller than the wire bond area of the inner bond pad.

5. A semiconductor die, comprising:
   an outer bond pad elongated in a first direction parallel to an edge of the semiconductor die, the outer bond pad having a probing area and two wire bond areas aligned in the first direction; and
   an inner bond pad elongated in a second direction perpendicular to the edge of the semiconductor die, the inner bond pad having one probing area and one wire bond area aligned in the second direction, wherein the outer bond pad is positioned closer to the edge of the semiconductor die than the inner bond pad, wherein the probing area of the inner bond pad is smaller than the wire bond area of the inner bond pad.

6. The semiconductor die of claim 5, wherein the probing area of the outer bond pad is smaller than either of the two wire bond areas of the outer bond pad.

7. The semiconductor die of claim 5, wherein the probing area of the outer bond pad is positioned between the two wire bond areas of the outer bond pad.

8. The semiconductor die of claim 4, wherein the outer bond pad is configured to provide ground or power connection to electrical circuit in the semiconductor die.

9. A semiconductor die, comprising:
   an outer bond pad elongated in a first direction parallel to an edge of the semiconductor die, the outer bond pad having a probing area and two wire bond areas aligned in the first direction; and
   an inner bond pad elongated in a second direction perpendicular to the edge of the semiconductor die, the inner bond pad having one probing area and one wire bond area aligned in the second direction, wherein the outer bond pad is positioned closer to the edge of the semiconductor die than the inner bond pad, wherein the outer bond pad is one of a row of outer bond pads aligned in the first direction and the inner bond pad is one of a row of inner bond pads aligned in the first direction, and wherein each of the row of outer bond pads has a first identical elongated shape with a probing area and two wire bond areas aligned in the first direction, and each of the row of inner bond pads has a second identical elongated shape with one probing area and one wire bond area aligned in the second direction.

10. The semiconductor die of claim 9, wherein each outer bond pad of the row of outer bond pads are configured to provide power connection or ground connection.

11. A semiconductor die, comprising:
    a row of outer bond pads aligned in a row direction parallel to an edge of the semiconductor die; and
    a row of inner bond pads aligned in the row direction along the row of outer bond pads and on a side of the row of outer bond pads opposite the edge of the semiconductor die, wherein each of the row of outer bond pads is elongated in the row direction and has two wire bond areas and a probing area, and wherein each of the row of inner bond pads is elongated perpendicular to the row direction and has a wire bond area and a probing area, wherein the probing area of an outer bond pad of the row of the outer bond pads is smaller than either of the two wire bond areas of the outer bond pad.

12. The semiconductor die of claim 11, wherein the probing area of the outer bond pad and the two wire bond areas of the outer bond pad are aligned in the row direction with the probing area positioned between the two wire bond areas.

13. The semiconductor die of claim 11, each outer bond pad of the row of outer bond pads are configured to provide power connection or ground connection.

14. A semiconductor die, comprising:
    a row of outer bond pads aligned in a row direction parallel to an edge of the semiconductor die; and
    a row of inner bond pads aligned in the row direction along the row of outer bond pads and on a side of the row of outer bond pads opposite the edge of the semiconductor die, wherein each of the row of outer bond pads is elongated in the row direction and has two wire bond areas and a probing area, and wherein each of the row of inner bond pads is elongated perpendicular to the row direction and has a wire bond area and a probing area, wherein the probing area of the inner bond pad is smaller than the wire bond area of the inner bond pad.

15. The semiconductor die of claim 14, the probing area of the inner bond pad and the wire bond area of the inner bond pad are aligned perpendicular to the row direction.

16. A method of making a semiconductor die, comprising:
    forming an outer bond pad elongated in a first direction parallel to an edge of the semiconductor die, the outer bond pad having a probing area and two wire bond areas aligned in the first direction; and
    forming an inner bond pad elongated in a second direction perpendicular to the edge of the semiconductor die, the inner bond pad having one probing area and one wire bond area aligned in the second direction, wherein the outer bond pad is positioned closer to the edge of the semiconductor die than the inner bond pad, wherein the probing area of the outer bond pad is smaller than either of the two wire bond areas of the outer bond pad and is positioned between the two wire bond areas of the outer bond pad.

17. The method of claim 16, the outer bond pad is configured to provide ground or power connection to electrical circuit in the semiconductor die.

18. A method of making a semiconductor die, comprising:
    forming an outer bond pad elongated in a first direction parallel to an edge of the semiconductor die, the outer bond pad having a probing area and two wire bond areas aligned in the first direction; and forming an inner bond pad elongated in a second direction perpendicular to the edge of the semiconductor die, the inner bond pad having one probing area and one wire bond area aligned in the second direction, wherein the outer bond pad is positioned closer to the edge of the semiconductor die than the inner bond pad, wherein the probing area of the inner bond pad is smaller than the wire bond area of the inner bond pad.

19. A method of making a semiconductor die, comprising:

forming an outer bond pad elongated in a first direction parallel to an edge of the semiconductor die, the outer bond pad having a probing area and two wire bond areas aligned in the first direction;

forming an inner bond pad elongated in a second direction perpendicular to the edge of the semiconductor die, the inner bond pad having one probing area and one wire bond area aligned in the second direction, wherein the outer bond pad is positioned closer to the edge of the semiconductor die than the inner bond pad; and forming a row of outer bond pads aligned in the first direction with the outer bond pad as one of the row of outer bond pads, wherein each of the row of outer bond pads has a first elongated shape with a probing area and two wire bond areas aligned in the first direction; and forming a row of inner bond pads aligned in the first direction with the inner bond pad as one of the row of inner bond pads, wherein each of the row of inner bond pads has a second elongated shape with one probing area and one wire bond area aligned in the second direction.

20. The method of claim 19, wherein each outer bond pad of the row of outer bond pads are configured to provide power connection or ground connection.

* * * * *